(12) United States Patent
Puik et al.

(10) Patent No.: US 8,236,377 B2
(45) Date of Patent: Aug. 7, 2012

(54) METHOD AND SYSTEM FOR PROCESSING FROZEN ADHESIVE PARTICLES

(75) Inventors: Erik Christian Nicolaas Puik, Eindhoven (NL); Edwin Johannes Theodorus Smulders, Nuenen (NL)

(73) Assignee: Nederlandse Organisatie voor toegepast-natuurwetenschappelijk onderzoek TNO (NL)

( * ) Notice: Subject to any disclaimer, the term of this patent is extended or adjusted under 35 U.S.C. 154(b) by 288 days.

(21) Appl. No.: 12/095,630

(22) PCT Filed: Dec. 4, 2006

(86) PCT No.: PCT/NL2006/000611
§ 371 (c)(1),
(2), (4) Date: Apr. 7, 2010

(87) PCT Pub. No.: WO2007/064204
PCT Pub. Date: Jun. 7, 2007

(65) Prior Publication Data
US 2010/0189892 A1   Jul. 29, 2010

(30) Foreign Application Priority Data
Dec. 2, 2005 (EP) .................................. 05077757

(51) Int. Cl.
*B05D 5/10* (2006.01)
(52) U.S. Cl. ............. 427/208.6; 427/177; 427/197; 427/348; 427/201; 427/207.1; 118/301; 118/304; 118/308

(58) Field of Classification Search ............... 427/207.1, 427/348, 177, 197, 201, 208.6; 118/301, 118/304, 308
See application file for complete search history.

(56) References Cited

U.S. PATENT DOCUMENTS

| 3,968,308 | A | 7/1976 | Buschfeld et al. | |
|---|---|---|---|---|
| 5,255,431 | A | 10/1993 | Burdick | |
| 5,531,942 | A | 7/1996 | Gilleo et al. | |
| 2004/0250769 | A1* | 12/2004 | Freeman et al. | 118/718 |
| 2005/0056682 | A1 | 3/2005 | Cobbley et al. | |
| 2005/0056946 | A1* | 3/2005 | Gilleo | 257/783 |

FOREIGN PATENT DOCUMENTS

| JP | 7204545 | 8/1995 |
|---|---|---|
| JP | 9328667 | 12/1997 |

* cited by examiner

*Primary Examiner* — Michael Cleveland
*Assistant Examiner* — Xiao Zhao
(74) *Attorney, Agent, or Firm* — Altera Law Group, LLC

(57) ABSTRACT

Method and system for moving a frozen adhesive particle towards a target body, comprising launching means (13) which are arranged to launch the particle (2) in its frozen form towards the target body (3, 4) via a movement path (14) through a gap (15) between the launching means and the target body. The medium in the gap may have a temperature above the adhesive particle's melting temperature. The launching means may be arranged to launch the particle at a high speed. The launching means and the target body may have a geometry causing that the movement path is substantially vertical or substantially horizontal.

5 Claims, 2 Drawing Sheets

FIG. 1 *Prior art*

METHOD AND SYSTEM FOR PROCESSING FROZEN ADHESIVE PARTICLES

FIELD

Figure 1:
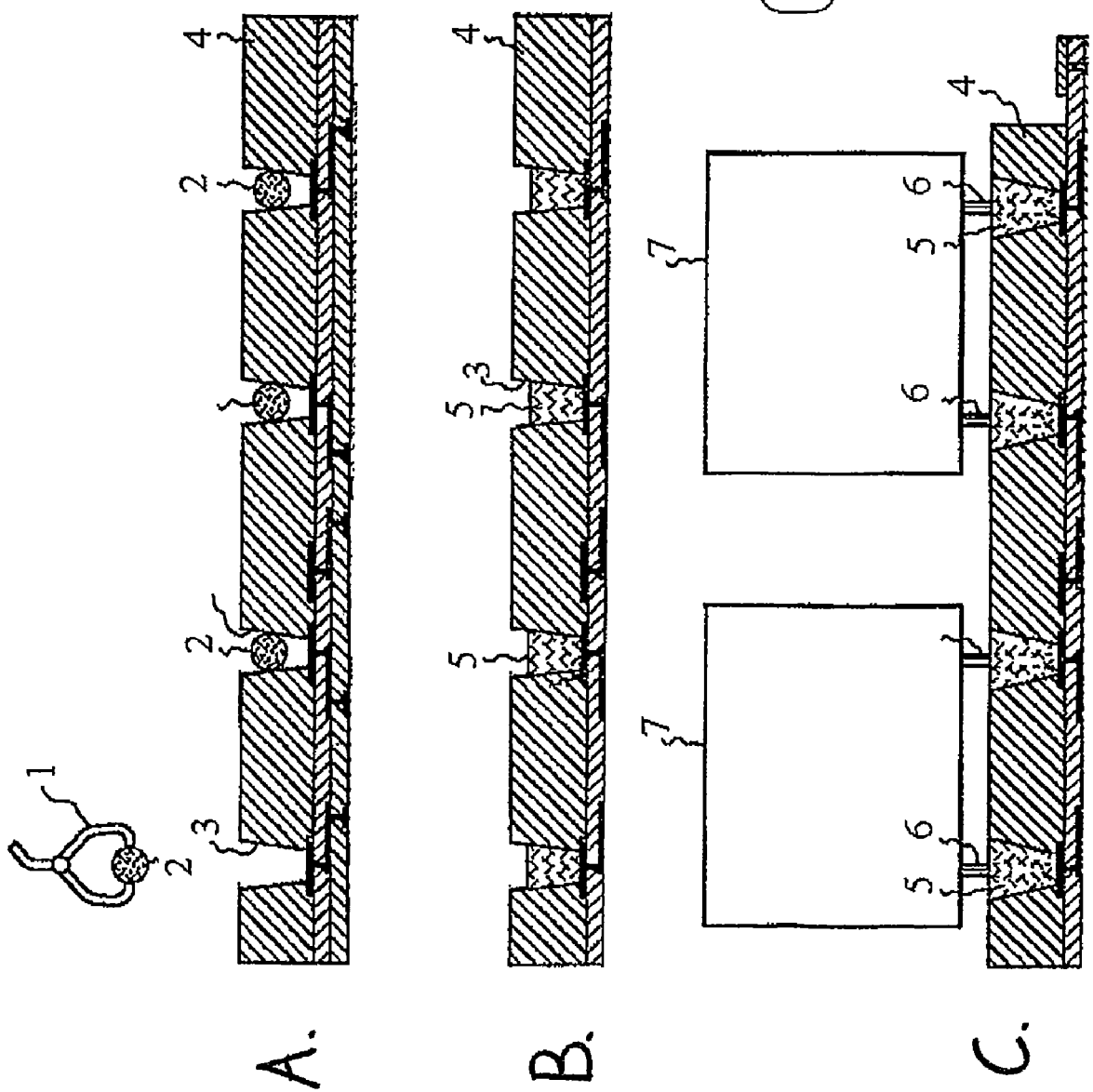

The invention refers to so-called Micro Electro Mechanical Systems (MEMS) or Micro System Technology (MST) wherein very tiny (e.g. electronic, optical, mechanical) components are build together. In the research labs since the 1980s, MEMS devices began to materialize as commercial products in the mid-1990s. They are used to make pressure, temperature, chemical and vibration sensors, light reflectors and switches as well as accelerometers for airbags, vehicle control, pacemakers and games. The technology is also used to make e.g. inkjet print heads, micro-actuators and all-optical switches.

BACKGROUND

MST/MEMS is a considerably growing market. Different market studies show that the average market growth for MST products and MST components amounts to more than 20% per year. Examples of successful MST products are acceleration sensors (e.g. automotive airbag sensors), pressure and flow sensors (automotive motor management, tyre pressure), inkjet printer heads and optic components (e.g. digital mirror devices for the purpose of beamers). The industry has made a considerable effort in the past five years in the field of the assemblage of microsystems. A number of precise assemblage steps have been developed that make it possible to execute precise micro assemblage steps. Meanwhile, it has become evident that there is a need, especially in the field of producing reliable micro connections, for the improvement of existing connection techniques on the basis of adhesives.

Adhesives can be a solution where the nature of the material combination that has to be connected does not permit any other connection technology like welding, soldering or mechanical connecting. Other advantages are:

No or little temperature stress (determined by the hardening temperature of the adhesives);
No complex geometric connection components or forms are needed;
Purity, usually less pollution, but also particularly less harmful pollution;
Connection over a relatively large surface, and because of that having a high bearing capacity;
Relatively low charges in the material Examples of situations in which adhesive connections have been applied successfully:

The adhesion of a synthetic micro lens with a diameter of 300 micrometer in a house and where the adhesive should not runs over the lens and the width of the border to be connected has to be smaller than 10 micron. Heat stress can here be permitted very limitedly because it affects the functionality of the lens;
The application of an adhesive connection on the housing of an inkjet head. The adhesive layer should, because of the functionality of the head, not be thicker than at the most 3 micron. Soldering connections lead, in such cases, because of thermal expansion differences of the materials combined with the thin connection points, to unacceptable high material stress.

The challenge of this type of products is to apply precisely and rapidly a very small quantity adhesive.

To illustrate this problem, the following embodiment. The volume of a drop of fluid is reflected by the following relation $V = \frac{1}{6}\pi d^3$, where the drop formed on the surface spreads out depending on the humidification. A good rule of thumb is that the dot diameter becomes two times the drop diameter.

| Dot diameter [micrometer] | Drop diameter [micrometer] | Volume (Nanoliter) |
| --- | --- | --- |
| 500 | 250 | 8.18 |
| 300 | 150 | 1.77 |
| 100 | 50 | 0.06 |
| 40 | 20 | 0.004 |

In this table, it is possible to see at what speed the drop volume decreases with the reducing of the dot diameter. As a result thereof it is desirable and necessary for the purpose of the said connection that very small quantities adhesives in the size of picoliters can be brought in. The following two objectives prove to be central here:

In order to bring in the desirable precise and sensitive cartridges it is necessary that very small quantities material can be precisely brought in;
In view of the fragile nature of microcomponents this process of bringing in should preferably take place without any contact.

Because of the large influence of the various viscosities on adhesion systems, various technologies have been developed in the course of time for the covering of different subfields.

In order to avoid the large influence of the various viscosities, it is known as such from U.S. Pat. No. 5,255,431 to cool down an adhesive material to a temperature where it gets a solid form. In this way the material characteristics of the most various adhesives are made comparable and the processing becomes independent of viscosity. At this low temperature a separation process can take place; e.g. grinding to powder, laminating and cutting, extrusion from thin wires and cutting, etc., and from whereof particles are created with a very small diameter and very small volume. These particles are stored until use at a low temperature (storage in a refrigerator is a usual method for adhesives). It should here be avoided that the particles start sticking of recombine. In frozen condition the particles are brought into the machine, where they are getting processed. In the prior art method the particles are finally put on/in the target surface by means of a 'pick & place' action. After the particles have been placed, the target surface and the particles are heated, causing that the adhesive particles thaw. After that the target surface and particles are subjected to a vacuum environment, removing possible enclosure of air within the particles.

With the prior art procedure a number of important advantages are obtained:

The viscosity of the (fluid) adhesive is not important any more because frozen material is used;
By using solid (viz. frozen) substances the separation of particles is simpler than with fluids. In fluid form adhesion plays a disturbing role in the separation process, because of the humidification behaviour of fluids. Solid substance, on the contrary, does not or minimally humidify and thus does not have these problems;
By dividing the separating and transfer action both functions can be better optimized for the primary task.

The prior art method uses pick & place handling of the frozen adhesive dots. The pick & place handling concept as such is a well-known, generic production method for e.g. electronic parts. In this process the relevant parts always remain in contact with minimal one other body. This can be the tray in which it is supplied, the gripper of het body upon which is being placed.

SUMMARY OF THE INVENTION

It has been observed that the prior art method and system can be improved w.r.t. (1) the mechanical stress of the target body, which may be a rather fragile microsystem component and, moreover, w.r.t. (2) contamination of the microsystem component and/or the adhesive particle transfer means.

As an improvement of the prior art method, the new method for moving a frozen adhesive particle towards a target body comprises that the particle is aligned relative to a target spot and that the particle is launched, by launching means, in its frozen form towards the target body, bridging, via a movement path, a gap between the launching means and the target body.

Preferably, the medium in the gap has a temperature above the adhesive particle's melting temperature, achieving that during the frozen particle's free flight through the gap between the launching means and the target body, the particle already begins to melt. The melting velocity can be set by the launching velocity and/or the temperature of the gap medium.

The manufacturing (mounting) time of the microsystem can be improved compared with the prior art because the particle preferably is launched at a high speed.

The movement path may be substantially vertical or—when launching with a high speed—horizontal.

So, according to this improved method the frozen adhesive particles—e.g. uncured epoxy particles—are launched to the microsystem's surface, preferably with an substantial force and speed. Each particle freely flies through the gap, e.g. containing of air or gas. During the particle's flight a state transition may occur, depending of the parameters of the gap environment (e.g. air or gas at a temperature above the adhesive's melting temperature), viz. from frozen to (partly) molten. This state transition during the particle's flight constitutes a contribution to the manufacturing speed of the microsystem.

During launching the adhesive particles from the launching means to the target body the particles don't have any contact with either the launching means or the target body. Bridging the gap between the launching means and the target body preferably is used to (partly) thaw the particles. The fly time results in an interaction freedom between the launching system and the target body which has the following advantages:

1. The target body—a fragile microsystem which may be damaged at the slightest touch—is not mechanically loaded by the particle transfer system.

2. Contamination of the transfer system and/or target body is prevented.

EXEMPLARY EMBODIMENT

Figure 2:
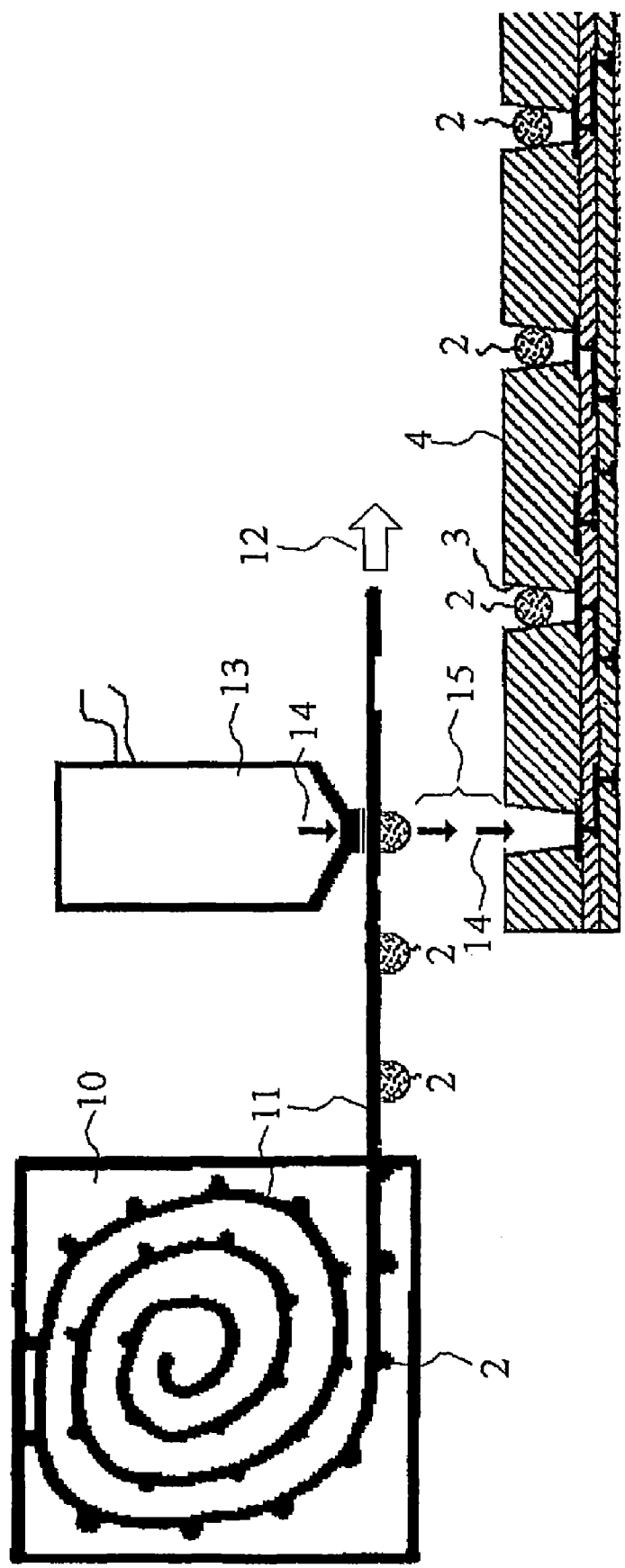

FIGS. 1a, 1b and 1c show the prior art system as known from U.S. Pat. No. 5,255,431;

FIG. 2 shows schematically a preferred embodiment of the present invention.

FIG. 1a depicts the use of the known pick-and-place equipment to place a sphere of uncured frozen epoxy; FIG. 1b shows the uncured epoxy in holes after thawing from its frozen state; FIG. 1c shows spheres of frozen epoxy thawing in a vacuum oven.

FIG. 1a illustrates the use of prior art pick-and-place equipment, represented by a manipulator 1, to place a sphere 2 of frozen epoxy into any one of well-like (blind) holes 3 in a mask layer 4. Sphere 2 has a predetermined size to occupy a corresponding predetermined volume; for example, in the case of holes 3 sized, frozen epoxy spheres 2 approximately 0.005 inch in diameter are employed. After epoxy spheres 2 are thawed to produce uncured epoxy material 5, the structure containing holes 3 appears as depicted in FIG. 1b, which illustrates thawed uncured epoxy material (adhesive, glue) prior to component pin insertion. As evident in FIG. 1b, holes 3 are not filled to the top with uncured epoxy material 5. Thus the resultant volume of uncured epoxy material 5 is controlled by selection of the size of frozen epoxy spheres 2 so that holes 3 do not overflow when the component pins 6 are later inserted. This is particularly critical since glue 5, being conductive, can cause shorts, especially as the epoxy drops in viscosity during cure. Thus holes 3 allow sufficient amounts of glue 5 to be present to yield good electrical connection to component pins, to provide mechanical integrity, and to constrain the epoxy.

To thaw frozen epoxy spheres 2, the mask layer 4 and frozen epoxy spheres 2 shown in FIG. 1a are warmed to approximately 25° C. (room temperature). To promote wetting and flow of the epoxy into holes 3 to arrive at the condition depicted in FIG. 1b, the mask layer 4 and frozen epoxy spheres 2 are warmed in a vacuum oven which is being evacuated. To remove any pockets of air trapped within holes 3 within the epoxy spheres 2.

After the epoxy is thawed, electronic components 7 (FIG. 1c) are placed e.g. by a pick and place machine (to avoid pin bending). If necessary to aid in part placement and epoxy flowout, epoxy-filled holes 3 are preheated slightly above thawing temperature, which lowers the epoxy viscosity. The complete module then is the ready for bake and cure. The cure is generally allowed to occur at a temperature in the range of e.g. 130°-150° C. for e.g. one or two hours, followed by a e.g. 170° to 200° C. post-bake cure for one-half hour (the temperatures and times are exemplary only, and of course vary with the particular epoxy which is used).

FIG. 2 shows schematically a preferred embodiment of the present invention, which is arranged for moving a frozen adhesive particle (e.g. a sphere 2) towards a target body 4, comprising a launching station 13 which are arranged to launch the particle 2 in its frozen form towards the target body 4 (or hole 3 respectively) via a movement path 14 through a gap 15 between the launching means 13 and the target body 4.

The adhesive particles (spheres) 2 are stored in the storage container 10 in the form of a conveyor belt 11 which comprises the particles 2. The belt 11—including the spheres 2—is moved in the direction of arrow 12. The adhesive spheres 2 are moved to launching station 13 which is able to align and shoot the spheres 2 into the holes 3 with a substantial speed (indicated by arrows 14), thus bridging the intermediate gap 15 between the launching station 12 and the opposite hole 3 in the target body 4. The conveyor belt 11, including the spheres 2, might be surrounded by a protective gas, to prevent oxidation of the adhesive. Besides, the gas could be given the right temperature to adjust the thaw velocity of the particles 2.

The start velocity of the launched sphere 2—caused by the launching station 13—may e.g. amount between 2 and 20 m/s. The size of the gap 15 may e.g. lie between 0.2 to 100 mm. At not any moment in the process there is a direct contact between the adhesive particle 2 (or the belt 11) and the target body 4 or the bottom or walls of the target holes 3. The launching station 13 may operate by means of an electromechanical, e.g. piezo-electric convertor, to release the relevant sphere 2 from the conveyor belt and to "fire" it into the opposite hole 3 in the target body 4 and an alignment system has put the sphere 2 in place relative to hole 3.

The temperature of the gap medium may be adapted to the characteristics of the spheres, the manufacturing speed, the velocity of the conveyor belt etc. The medium in the gap e.g. may have a temperature above the adhesive particle's melting temperature, resulting in quick filling the hole 3 with minimal air/gas inclusions. The launching means 10-13 and the target body 4 may have a geometry causing that the movement path 14 is substantially vertical, as illustrated in FIG. 2, or—by rotating the whole configuration 90 degrees—horizontally. When a configuration is used having a horizontal movement path, the gravitational deflection of the spheres has to discounted in the adjustment of the right launching position and moment.

The invention claimed is:

1. Method for depositing a frozen adhesive particle in picoliter portions at a predetermined spot on a target body from a launcher, comprising aligning said particle relative to said spot on a belt system; launching said particle, in its frozen form, from the belt system in a free flight towards the target body (3,4), and bridging, via a movement path (14), a gap (15) between the launcher and the target body so as to deposit said particle on said predetermined spot.

2. Method according to claim 1, the medium in the gap having a temperature above the adhesive particle's melting temperature.

3. Method according to claim 1, the movement path being substantially vertical.

4. Method according to claim 1, the movement path being substantially horizontal.

5. Method according to claim 1, the launcher and the target body comprising a geometry causing that the movement path is substantially horizontal.

\* \* \* \* \*